(12) United States Patent
Carter et al.

(10) Patent No.: US 6,518,842 B1
(45) Date of Patent: Feb. 11, 2003

(54) BIPOLAR RAIL-TO-RAIL INPUT STAGE WITH SELECTABLE TRANSITION THRESHOLD

(75) Inventors: Nathan Carter, Arroyo Grande, CA (US); JoAnn P. Close, Los Altos, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/165,496

(22) Filed: Jun. 7, 2002

(51) Int. Cl.[7] .................................................. H03F 3/45
(52) U.S. Cl. ........................ 330/257; 330/252; 330/261
(58) Field of Search ................................ 330/252, 257, 330/261

(56) References Cited

U.S. PATENT DOCUMENTS 5,371,474 A * 12/1994 Wassenaar et al. ......... 330/253
5,714,906 A * 2/1998 Motamed et al. ........... 330/257
6,462,619 B1 * 10/2002 Ivanov et al. ............... 330/253

* cited by examiner

Primary Examiner—Patricia T. Nguyen
(74) Attorney, Agent, or Firm—Koppel, Jacobs, Patrick & Heybl

(57) ABSTRACT

A bipolar rail-to-rail input stage includes complementary differential input pairs, and a switching circuit which makes one or the other of the input pairs active depending on the relationship between a transition threshold voltage $V_{th}$ and the common mode input voltage $V_{cm}$. A transition threshold voltage selection circuit provides a selectable one of at least two different $V_{th}$ voltages to the switching circuit in response to a select signal. In one embodiment, the select signal has logic "high", logic "low", and "floating" states. The transition threshold voltage selection circuit provides a first $V_{th}$ voltage when the select signal is in a first state, a second $V_{th}$ voltage when the select signal is in a second state, and disables the input stage when the select signal is in a third state.

15 Claims, 4 Drawing Sheets

BIPOLAR RAIL-TO-RAIL INPUT STAGE WITH SELECTABLE TRANSITION THRESHOLD

BACKGROUND OF THE INVENTION

1. Field of the Invention

This invention relates to the field of rail-to-rail amplifiers, and particularly to methods of establishing the transition threshold between the differential input pairs of a rail-to-rail amplifier.

2. Description of the Related Art

A rail-to-rail amplifier's input stage typically includes complementary differential pairs. One differential pair conducts when the common mode voltage $V_{cm}$ applied to the amplifier's inputs is above a particular threshold voltage $V_{th}$, and the other pair conducts when $V_{cm}$ is less than $V_{th}$.

A typical bipolar rail-to-rail input stage is shown in FIG. 1. A PNP differential pair Q1 and Q2 have their emitters connected to a common mode node 10, and an NPN differential pair Q3 and Q4 have their emitters connected to a common mode node 12. The bases of Q1 and Q3 are connected to receive one side (VN) of a differential input signal, and the bases of Q2 and Q4 are connected to receive the other side (VP) of the input signal. Input stage transistors Q1, Q2, Q3 and Q4 produce currents IPP, IPN, INP and INN, respectively, in response to a differential voltage applied at VN and VP. To form a complete rail-to-rail amplifier, currents IPP, IPN, INP and INN are routed to an output stage (not shown) which produces the amplifier's output voltage.

This type of input stage typically includes a tail current source 14 which provides a tail current $I_{tail}$ to the input stage transistors. The input stage is arranged such that $I_{tail}$ is provided to common mode node 10 when the common mode input voltage $$V_{cm}\left(=\frac{VN + VP}{2}\right)$$

is less than $V_{th}$, and to common mode node 12 when $V_{cm} > V_{th}$.

One possible mechanism for steering $I_{tail}$ to the proper node uses a steering transistor $Q_S$, which is connected between node 10 and a pair of transistors $Q_{m1}$ and $Q_{m2}$ which form a current mirror that mirrors the current in $Q_S$ to common mode node 12. Threshold voltage $V_{th}$ is applied to the base of $Q_S$. When arranged in this way, when $V_{cm} << V_{th}$, $Q_S$ is off, $I_{tail}$ is provided to common mode node 10, and Q1 and Q2 are active. When $V_{cm} >> V_{th}$, $Q_S$ is on, $I_{tail}$ is provided to common mode node 12, and Q3 and Q4 are active.

Unfortunately, as the common-mode input voltage crosses $V_{th}$, a discontinuity appears in the output due to crossover distortion. The threshold voltage is generally skewed toward one rail or the other in order to yield the widest distortion-free input range. However, unless the amplifier receives a input voltage which operates over a known, limited range, crossover distortion will inevitably occur.

SUMMARY OF THE INVENTION

A bipolar rail-to-rail input stage is presented which overcomes the problem noted above. A user is allowed to select a desired transition threshold voltage via a "select" signal, thereby providing a selectable crossover-distortion-free common mode input voltage range.

The input stage includes complementary differential input pairs, and a switching circuit which makes one or the other of the input pairs active depending on the relationship between a transition threshold voltage $V_{th}$ and the common mode input voltage $V_{cm}$. The present input stage also includes a transition threshold voltage selection circuit which provides a selectable one of at least two different $V_{th}$ voltages to the switching circuit in response to a select signal.

The present input stage is preferably arranged such that it can be turned off in response to a disable signal. In this embodiment, the select signal has first, second, and third states which correspond to logic "high", logic "low", and "floating" states. The transition threshold voltage selection circuit is arranged to provide a first $V_{th}$ voltage to the switching circuit when the select signal is in a first state, to provide a second $V_{th}$ voltage when the select signal is in a second state, and to assert the disable signal and thereby turn the input stage off when the select signal is in a third state.

Further features and advantages of the invention will be apparent to those skilled in the art from the following detailed description, taken together with the accompanying drawings.

DETAILED DESCRIPTION OF THE INVENTION

Figure 2:
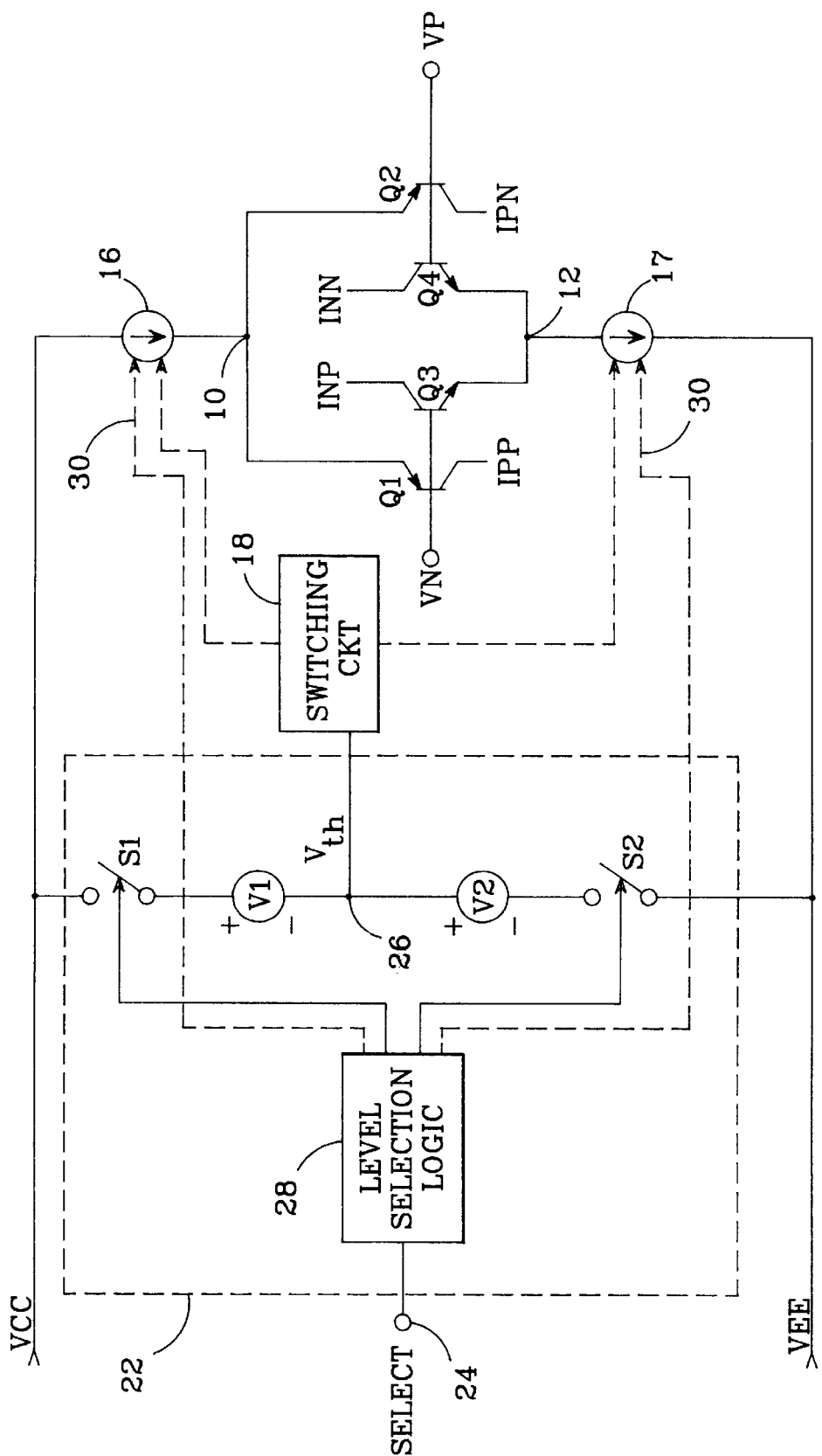
FIG. 2 is a schematic/block diagram of a rail-to-rail input stage per the present invention.

A bipolar rail-to-rail input stage with a selectable transition threshold is shown in FIG. 2. The core input stage is as described above: a PNP differential pair Q1, Q2 and an NPN differential pair Q3, Q4 are connected to receive a differential input signal applied to input terminals VN and VP. A tail current source 16 is connected to common mode 10 (junction of emitters of Q1 and Q2) and a tail current source 17 is connected to common mode 12 (junction of emitters of Q3 and Q4). A switching circuit 18 controls which of the input pairs is active: when the common-mode input voltage $$V_{cm}\left(=\frac{VN + VP}{2}\right)$$

is less than a threshold voltage $V_{th}$ applied to the switching circuit, PNP transistors Q1 and Q2 are made active. Similarly, when $V_{cm}$ is greater than $V_{th}$, NPN transistors Q3 and Q4 are made active. Switching between the input pairs would typically be controlled by controlling the tail current provided to common mode nodes 10 and 12; however, the invention encompasses the use of other switching mechanisms which switch between complementary input pairs depending on the relationship between $V_{cm}$ and $V_{th}$.

As noted above, crossover distortion occurs as $V_{cm}$ crosses $V_{th}$, which causes input signal amplification to switch from one input pair to the other. The invention allows a user to select the value of transition threshold voltage $V_{th}$, and thereby the common-mode input range over which the input stage is crossover-distortion-free, using a SELECT signal. A transition threshold voltage selection circuit 22 receives the SELECT signal at a terminal 24 (typically a pin of an integrated circuit package), and produces a particular transition threshold voltage $V_{th}$ in response.

FIG. 2 illustrates an exemplary embodiment of transition threshold voltage selection circuit 22. Threshold transition voltage $V_{th}$ is provided at a node 26, which is connected to two voltage sources V1 and V2. A pair of switches S1 and S2 are connected in series with V1 and V2, such that when S1 is closed and S2 is open, node 26 (and thus threshold transition voltage $V_{th}$) goes to a first voltage $V_{th1}$ established by V1, and when S2 is closed and S1 is open, node 26 goes to a second voltage $V_{th2}$ established by V2. S1 and S2 are controlled with a level selection logic circuit 28, which receives SELECT at an input and operates S1 and S2 in response.

The selectable transition threshold voltages would typically be set about $V_{be}+V_{sat}$ below VCC and about $V_{be}+V_{sat}$ above VEE, so that with either threshold voltage selected, a majority of the common-mode input range is crossover-distortion-free. However, the invention is not limited to transition threshold voltages near the supply rails: the selectable voltages may be set wherever they might be useful for a particular application.

The SELECT signal may have two states—logic "high" and logic "low", for example. In this case, $V_{th}$ is set to $V_{th1}$ when SELECT is in one of the two states, and $V_{th}$ is set to $V_{th2}$ when SELECT is in the other state.

Alternatively, the SELECT signal may be a tri-state signal, having logic "high", logic "low", and floating states. This is useful when the input stage can be disabled in response to a disable signal. This can be accomplished by, for example, turning off the bias voltages that the input stage requires to operate; in this case, the "disable signal" simply comprises the termination of the bias voltages. This is illustrated in FIG. 2: tail current sources 16 and 17 are made controllable, such that they can be turned off in response to a disable signal 30. Here, level selection logic 28 is arranged to respond to each of the SELECT signals three states: node 26 is made equal to $V_{th1}$ or $V_{th2}$ when the SELECT signal is in a first state or a second state, respectively, and disable signal 30 is asserted when SELECT is in its third state. Transition threshold selection circuit 22 might also be arranged to disable voltage sources V1 and V2 when SELECT is in its third state.

Note that the invention is not limited to the generation of two selectable transition threshold voltages; the concept might also be applied to the provision of additional threshold voltages. For example, if SELECT is a tri-state signal, transition threshold selection circuit 22 could be arranged to generate three different threshold voltages, which are switchably connected to node 26 in response to SELECT. More than three threshold voltages could be accommodated, but this would require the use of more than one select signal. For example, the invention could provide nine selectable threshold voltages with the use of two tri-state select signals.

Figure 1:
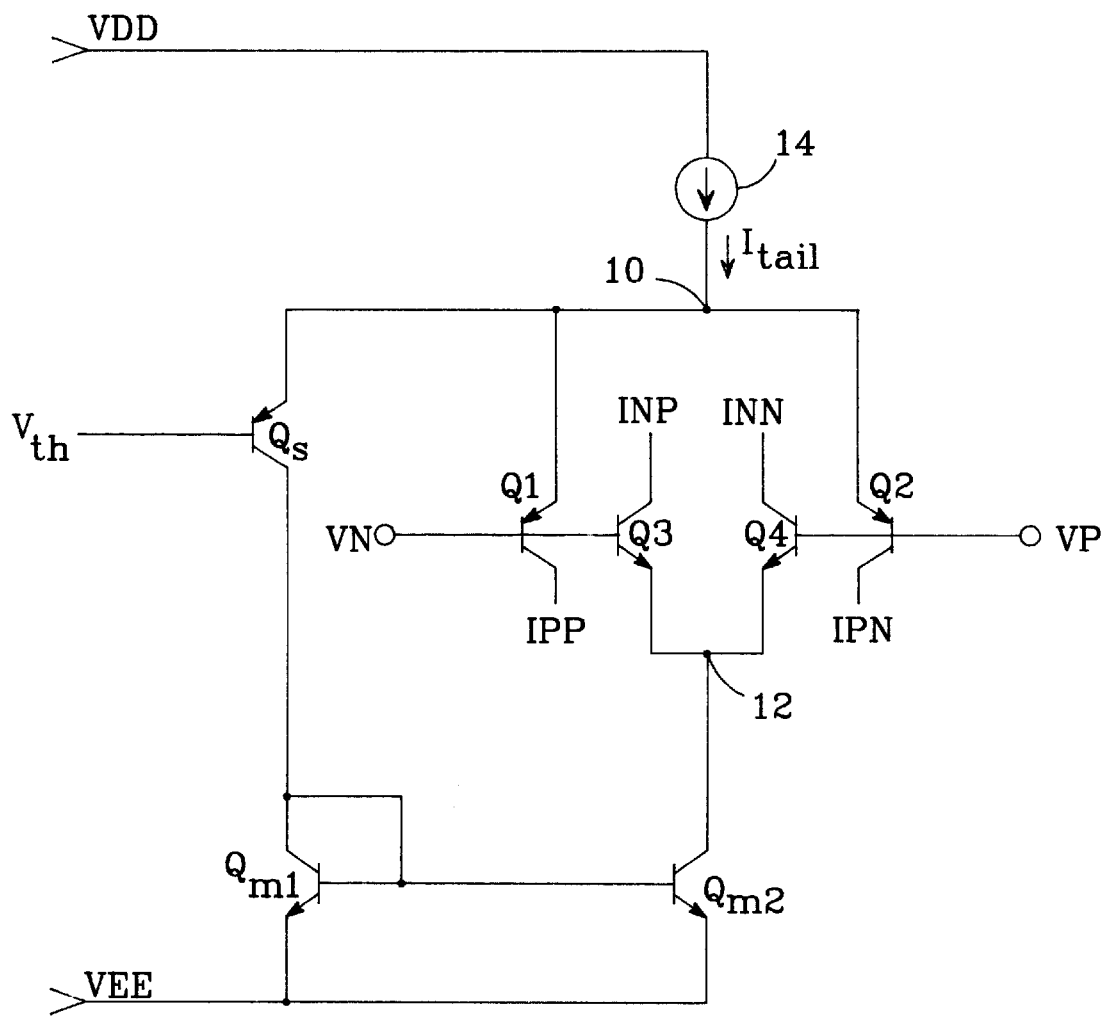
FIG. 1 is a schematic diagram of a known rail-to-rail input stage.
Figure 3:
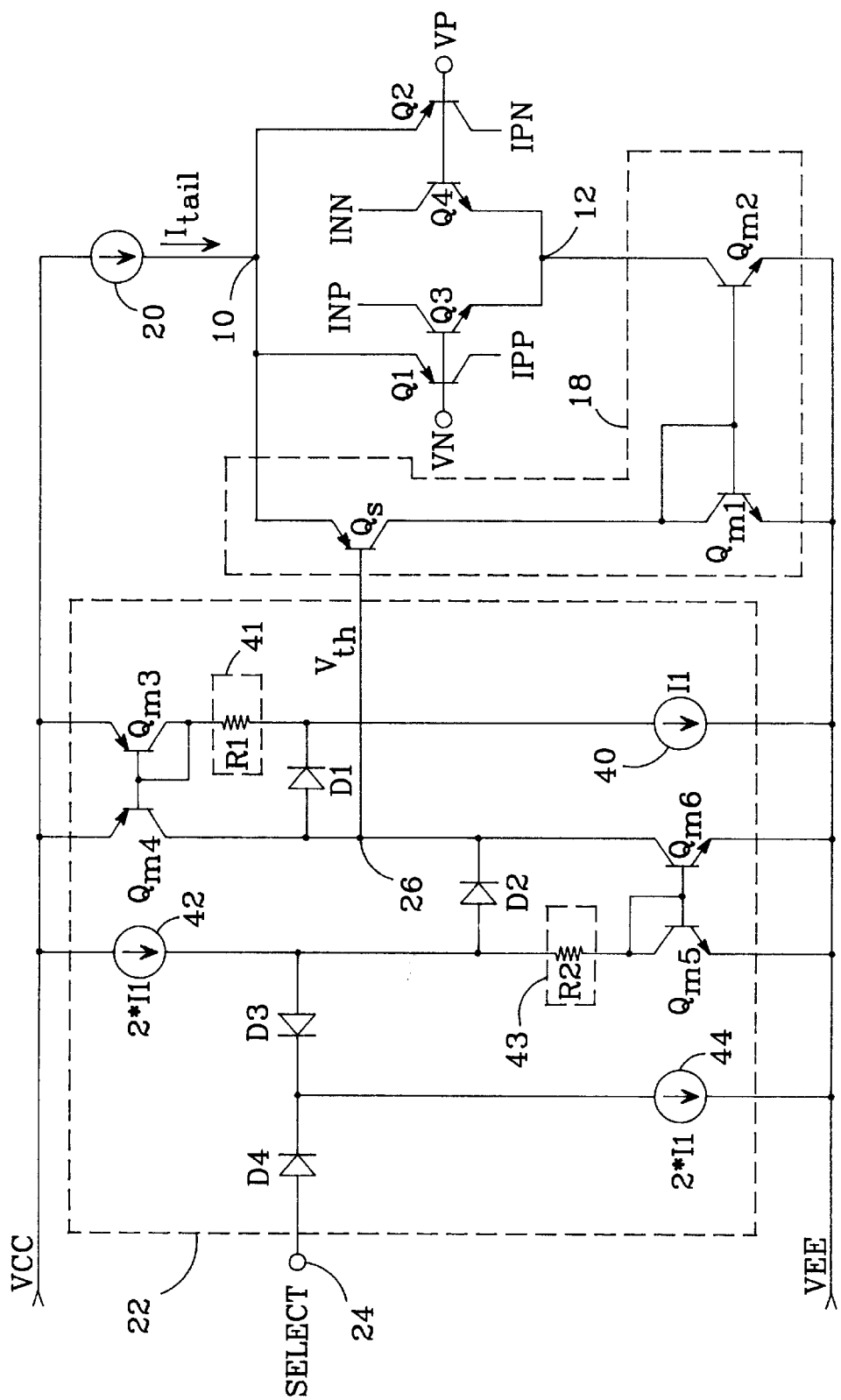
FIG. 3 is a schematic diagram of one possible embodiment of a rail-to-rail input stage per the present invention.

One possible embodiment of transition threshold selection circuit 22 is shown in FIG. 3. FIG. 3 illustrates a preferred implementation of switching circuit 18, which is similar to the steering circuit shown in FIG. 1: a tail current source 20 provides tail current $I_{tail}$ to common mode node 10, steering transistor $Q_S$ receives threshold voltage $V_{th}$ at its base and is connected between node 10 and a current mirror formed with transistors $Q_{m1}$ and $Q_{m2}$ which mirrors current conducted by steering transistor $Q_S$ to common mode 12. When $V_{cm}$ is less than $V_{th}$, $Q_S$ is essentially off, $I_{tail}$ is provided to common mode 10, and PNP transistors Q1 and Q2 are active. When $V_{cm}$ is greater than $V_{th}$, $Q_S$ is essentially on, $I_{tail}$ is provided to common mode 12, and NPN transistors Q3 and Q4 are active.

The threshold voltage $V_{th}$ is established at node 26 using two current-limited voltage sources. A high threshold voltage is provided by a first current-limited voltage source, which comprises a current source 40 connected to the input transistor $Q_{m3}$ of a current mirror (via a resistance 41, represented here as a resistor R1). Current source 40 provides a current I1, which is mirrored to node 26 via the mirror's output transistor $Q_{m4}$. A diode D1 is connected between $Q_{m4}$ and current source 40, that ensures that current I1 is split evenly between $Q_{m3}$ and $Q_{m4}$, which have a ratio of 1:1. Similarly, a low threshold voltage is provided by a second current-limited voltage source, which comprises a current source 42 connected to the input transistor $Q_{m5}$ of a current mirror (via a resistance 43, represented here as a resistor R2). Current source 42 provides a current 2*I1, which is mirrored to node 26 via the mirror's output transistor $Q_{m6}$. A diode D2 connected between $Q_{m6}$ and current source 42 ensures that current 2*I1 is split evenly between $Q_{m5}$ and $Q_{m6}$, which have a ratio of 1:1.

The threshold voltage at node 26 is controlled by affecting the current 2*I provided by current source 42. A diode D3 is connected between the output of current source 42 and a current source 44, which also provides a current 2*1, and a diode D4 is connected between SELECT terminal 24 and D3. In operation, when SELECT is high, a current equal to 2*I1 is provided to current source 44, such that the output of current source 42 is allowed to flow to the $Q_{m5}/Q_{m6}$ current mirror. Since current source 42 provides twice the current of current source 40, the low threshold voltage source overwhelms the high threshold voltage source, node 26 is pulled low, and a low threshold voltage is provided to $Q_S$.

If SELECT is left floating or pulled low, the current produced by current source 42 is bypassed to current source 44 via diode D3. This allows the high threshold voltage source to pull node 26 high, such that the high threshold voltage is provided to $Q_S$.

If the input stage is arranged to be disabled in response to a disable signal, the transition threshold voltage selection circuit can be arranged to generate the disable signal in response to pulling the SELECT signal low.

Note that the implementation of transition threshold selection circuit 22 shown in FIG. 3 is merely exemplary. There are a numerous ways in which two or more selectable transition threshold voltages might be generated and controlled with a SELECT signal.

Figure 4:
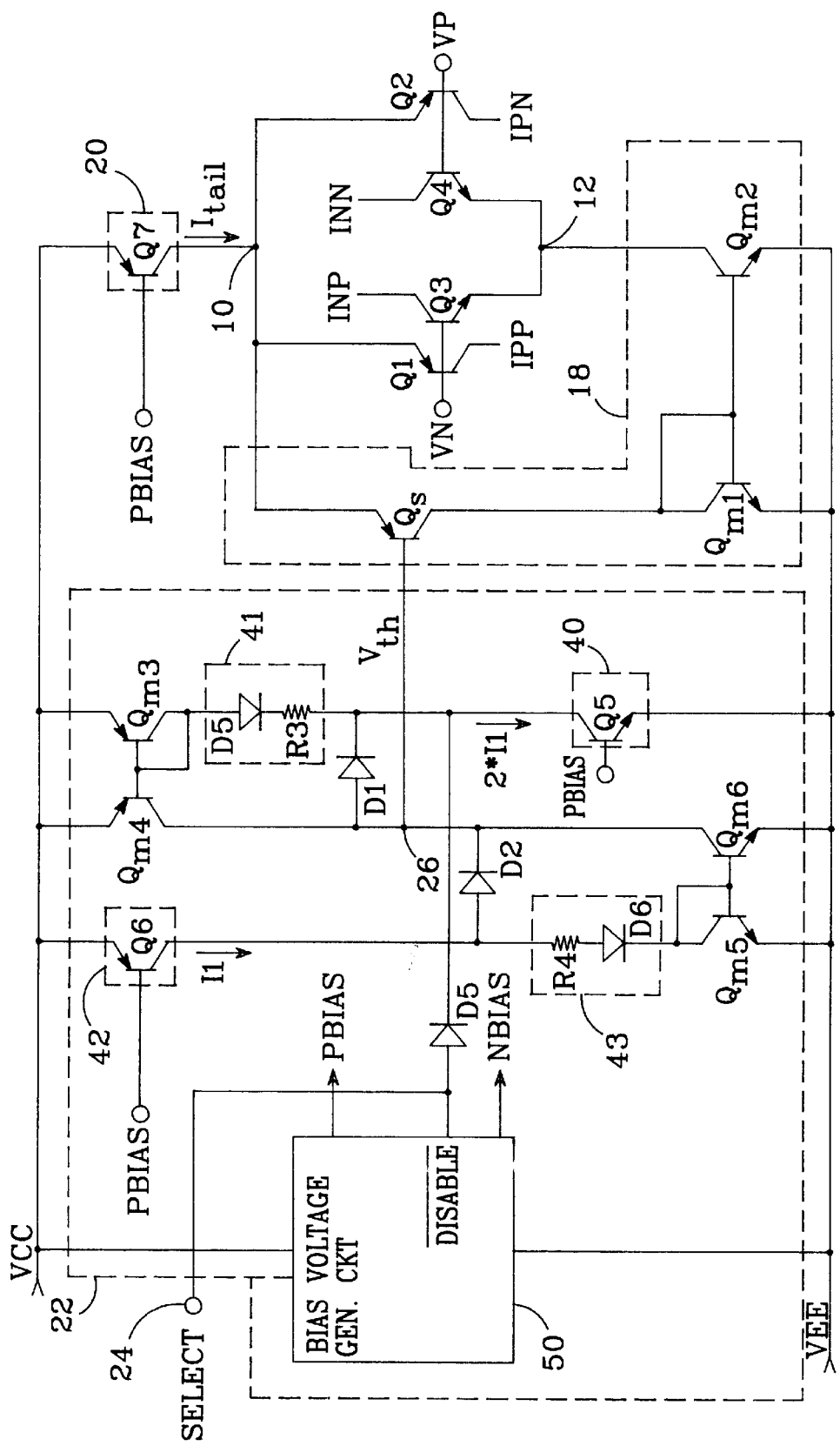
FIG. 4 is a schematic diagram of another possible embodiment of a rail-to-rail input stage per the present invention.

Another possible embodiment of a rail-to-rail input stage per the present invention is shown in FIG. 4. This implementation employs a tri-state SELECT signal. Here, current sources 40 and 42 are implemented with an NPN transistor Q5 and a PNP transistor Q6, respectively, which are driven with respective bias voltages NBIAS and PBIAS. In this arrangement, current source transistor Q5 is made twice the size of Q6, such that Q6 provides a current I1 to $Q_{m5}$ and Q5 provides a current 2*I1 to $Q_{m3}$. (Note that this relationship between the output currents of current sources 40 and 42 is opposite to that described in connection with FIG. 3). Tail current source 20 is also implemented with a transistor Q7, which is driven with bias voltage PBIAS. Resistance 41 is preferably implemented with a resistor R3 and a diode D5 connected in series, and resistance 43 is made from a resistor R4 and a diode D6 connected in series.

Transition threshold selection circuit 22 includes a bias generating circuit 50 which provides bias voltages NBIAS and PBIAS while the SELECT signal is high or floating, and turns NBIAS and PBIAS off when SELECT is low. In operation, when SELECT terminal 24 is floating, current sources 40 and 42 provide currents 2*I1 and I1, respectively, the high threshold voltage source overwhelms the low threshold voltage source, and node 26 is pulled high. When SELECT terminal 24 is pulled high, the current required by current source 40 is provided by SELECT via a diode D5, thereby allowing the low threshold voltage source to pull node 26 low. When SELECT is pulled low, bias voltage generating circuit 50 turns off bias voltages PBIAS and NBIAS, thereby disabling the input stage (due to the absence of tail current), as well as disabling transition threshold select circuit 22 (due to the absence of I1 and 2*I1).

When so arranged, the low threshold voltage $V_{th1}$ (SELECT pulled high) is defined by:

$$V_{th1}=V_{BE(Qm5)}+(I1/2)*R4$$

When SELECT is floating, the high threshold voltage $V_{thh}$ is defined by:

$$V_{thh}=V_{BE(Qm3)}+((3*I1)/2)*R3$$

Thus, the selectable threshold voltages can be set by properly selecting the values of I1, R3 and R4.

While particular embodiments of the invention have been shown and described, numerous variations and alternate embodiments will occur to those skilled in the art. Accordingly, it is intended that the invention be limited only in terms of the appended claims.

We claim:

1. A bipolar rail-to-rail input stage with a selectable transition threshold, comprising:

an input stage comprising:
 a first differential pair comprising first and second PNP transistors having their bases connected to receive a differential input signal and arranged to conduct respective collector currents which vary with said differential input signal, said differential input signal having a common mode voltage $V_{cm}$, the emitters of said first and second PNP transistors connected together at a first common mode node,
 a second differential pair comprising first and second NPN transistors having their bases connected to receive said differential input signal and arranged to conduct respective collector currents which vary with said differential input signal, the emitters of said first and second NPN transistors connected together at a second common mode node,
 at least one tail current source circuit arranged to provide tail current to said first and second common mode nodes,
 a switching circuit connected to receive a transition threshold voltage $V_{th}$ and arranged to make said first differential pair active when $V_{cm}<V_{th}$ and to make said second differential pair active when $V_{cm}>V_{th}$, and
a transition threshold voltage selection circuit which receives a select signal at an input and which provides $V_{th}$ to said switching circuit, said selection circuit arranged to provide a selectable one of at least two different $V_{th}$ voltages in response to said select signal.

2. A bipolar rail-to-rail input stage with a selectable transition threshold, comprising:

an input stage comprising:
 a first differential pair comprising first and second PNP transistors having their bases connected to receive a differential input signal and arranged to conduct respective collector currents which vary with said differential input signal, said differential input signal having a common mode voltage $V_{cm}$, the emitters of said first and second PNP transistors connected together at a first common mode node,
 a second differential pair comprising first and second NPN transistors having their bases connected to receive said differential input signal and arranged to conduct respective collector currents which vary with said differential input signal, the emitters of said first and second NPN transistors connected together at a second common mode node,
 a tail current source circuit arranged to provide a tail current $I_{tail}$ to said first common mode node,
 a current mirror circuit having an input and an output and arranged to provide a current at its output which varies with a current applied at its input, said current mirror output connected to said second common mode node, and
 a steering transistor having a current circuit and a control input, said current circuit connected between said first common mode node and said current mirror circuit input and said control input connected to receive a transition threshold voltage $V_{th}$, said steering transistor arranged such that it is off when $V_{cm}<<V_{th}$ such that tail current $I_{tail}$ is provided to said first common mode node, and is on when $V_{cm}>>V_{th}$ such that tail current $I_{tail}$ is provided to said second common mode node, and
a transition threshold voltage selection circuit which receives a select signal at an input and which provides $V_{th}$ to said steering transistor, said selection circuit arranged to provide a selectable one of at least two different $V_{th}$ voltages in response to said select signal.

3. The input stage of claim 2, wherein said tail current source circuit, said first and second differential pairs, and said current mirror circuit are connected between first and second supply voltages, said transition threshold voltage selection circuit arranged to provide first and second selectable $V_{th}$ voltages such that said first selectable $V_{th}$ voltage is within about $V_{be}+V_{sat}$ of said first supply voltage and said second selectable $V_{th}$ voltage is within about $V_{be}+V_{sat}$ of said second supply voltage.

4. The input stage of claim 2, wherein said select signal has first and second states, said transition threshold voltage selection circuit arranged to provide a first $V_{th}$ voltage to said steering transistor when said select signal is in said first state and to provide a second $V_{th}$ voltage to said steering transistor when said select signal is in said second state.

5. The input stage of claim 2, wherein said select signal has first, second, and third states which correspond to logic "high", logic "low", and "floating" states, said input stage arranged to be turned off in response to a disable signal, said transition threshold voltage selection circuit arranged to provide a first $V_{th}$ voltage to said steering transistor when said select signal is in one of said first, second, or third states, to provide a second $V_{th}$ voltage to said steering transistor when said select signal is in another one of said first, second, or third states, and to assert said disable signal and thereby turn said input stage off when said select signal is in the remaining one of said first, second, or third states.

6. The input stage of claim 2, wherein said transition threshold voltage selection circuit comprises:
 a first current-limited voltage source which provides a first current to a third node which provides said transition threshold voltage $V_{th}$ to said steering transistor, and
 a second current-limited voltage source which provides a second current greater than said first current,
 said transition threshold voltage selection circuit arranged such that when said select signal is in a first state, said second current is not provided to said third node such that said first current drives said third node to a first threshold transition voltage $V_{th1}$, and when said select signal is in a second state, said second current is provided to said third node such that said second current overwhelms said first current and drives said third node to a second threshold transition voltage $V_{th2}$.

7. The input stage of claim 6, wherein each of said first and second current-limited voltage sources comprises:
a current source,
a current mirror which includes a bipolar input transistor and a bipolar output transistor, said current mirror arranged to mirror the output of said current source to said third node,
a first diode connected between the collectors of said mirror's input and output transistors to remove current from said mirror's input transistor until said current mirror provides a 1:1 current ratio, and
a resistance connected between said mirror's input transistor and said first diode which establishes a voltage at the collector of said mirror's output transistor.

8. The input stage of claim 7, wherein said transition threshold voltage selection circuit further comprises a second diode connected to divert the output of said second current-limited voltage source's current source from its current mirror when said select signal is in said first state such that said second current is not provided to said third node.

9. The input stage of claim 7, wherein each of said resistances comprises a second diode connected in series with a resistor such that the current conducted by said current-limited voltage source's current mirror creates a voltage across said resistance which establishes said voltage at the collector of said mirror's output transistor.

10. The input stage of claim 7, wherein said transition threshold voltage selection circuit further comprises a bias voltage generating circuit and said current source comprises a transistor which conducts said current source's output current in response to a bias voltage provided by said bias voltage generating circuit.

11. The input stage of claim 10, wherein said select signal has first, second, and third states which correspond to logic "high", logic "low", and "floating" states, said input stage arranged to be turned off in response to a disable signal, said transition threshold voltage selection circuit arranged to provide a first $V_{th}$ voltage to said steering transistor when said select signal is in one of said first, second, or third states, to provide a second $V_{th}$ voltage to said steering transistor when said select signal is in another one of said first, second, or third states, and to turn off said bias voltages and to assert said disable signal and thereby turn off said input stage when said select signal is in the remaining one of said first, second, or third states.

12. A bipolar rail-to-rail input stage with a selectable transition threshold, comprising:
an input stage comprising:
a first differential pair comprising first and second PNP transistors having their bases connected to receive a differential input signal and arranged to conduct respective collector currents which vary with said differential input signal, said differential input signal having a common mode voltage $V_{cm}$, the emitters of said first and second PNP transistors connected together at a first common mode node, a second differential pair comprising first and second NPN transistors having their bases connected to receive said differential input signal and arranged to conduct respective collector currents which vary with said differential input signal, the emitters of said first and second NPN transistors connected together at a second common mode node,
a tail current source circuit arranged to provide a tail current $I_{tail}$ to said first common mode node,
a current mirror circuit having an input and an output and arranged to provide a current at its output which varies with a current applied at its input, said current mirror output connected to said second common mode node, and
a steering transistor having a current circuit and a control input, said current circuit connected between said first common mode node and said current mirror circuit input and said control input connected to receive a transition threshold voltage $V_{th}$, said steering transistor arranged such that it is off when $V_{cm} \ll V_{th}$ such that tail current $I_{tail}$ is provided to said first common mode node, and is on when $V_{cm} \gg V_{th}$ such that tail current $I_{tail}$ is provided to said second common mode node, and
a transition threshold voltage selection circuit which receives a select signal having first, second, and third states which correspond to logic "high", logic "low", and "floating" states, said input stage arranged to be turned off in response to a disable signal, said transition threshold voltage selection circuit arranged to provide a first voltage $V_{th1}$ to said steering transistor when said select signal is in one of said first, second, or third states, to provide a second voltage $V_{th2}$ to said steering transistor when said select signal is in another one of said first, second, or third states, and to assert said disable signal and thereby turn off said input stage when said select signal is in the remaining one of said first, second, or third states.

13. The input stage of claim 12, wherein said tail current source circuit, said first and second differential pairs, and said current mirror circuit are connected between first and second supply voltages, said transition threshold voltage selection circuit arranged such that $V_{th1}$ is within about $V_{be}+V_{sat}$ of said first supply voltage and $V_{th2}$ is within about $V_{be}+V_{sat}$ of said second supply voltage.

14. The input stage of claim 12, wherein said transition threshold voltage selection circuit comprises:
a first current-limited voltage source which provides a first current to a third node which provides said transition threshold voltage $V_{th}$ to said steering transistor, and
a second current-limited voltage source which provides a second current greater than said first current,
said transition threshold voltage selection circuit arranged such that when said select signal is in a first state, said second current is not provided to said third node such that said first current drives said third node to said threshold transition voltage $V_{th1}$, and when said select signal is in a second state, said second current is provided to said third node such that said second current overwhelms said first current and drives said third node to said threshold transition voltage $V_{th2}$.

15. The input stage of claim 14, wherein said a transition threshold voltage selection circuit further comprises a bias voltage generating circuit, each of said first and second current-limited voltage sources comprising:
        a transistor which conducts a current $I_{ref}$ in response to a bias voltage provided by said bias voltage generating circuit,
        a current mirror which includes a bipolar input transistor and a bipolar output transistor, said current mirror arranged to mirror $I_{ref}$ to said third node,
        a first diode connected between the collectors of said mirror's input and output transistors to remove current from said mirror's input transistor until said current mirror provides a 1:1 current ratio, and
        a resistance connected between said mirror's input transistor and said first diode which establishes a voltage at the collector of said mirror's output transistor, said transition threshold voltage selection circuit arranged to turn off said bias voltages when said select signal is in the remaining one of said first, second, or third states and said disable signal is asserted.

\* \* \* \* \*